(12) United States Patent
Wang

(10) Patent No.: US 11,629,229 B2
(45) Date of Patent: Apr. 18, 2023

(54) HYDROPHOBIC POLYIMIDE MATERIAL AND PREPARATION METHOD THEREOF, AND ORGANIC ELECTROLUMINESCENCE LIGHT EMITTING DIODE

(71) Applicant: Wuhan China Star Optoelectronics Semiconductor Display Technology Co., LTD., Hubei (CN)

(72) Inventor: Yamin Wang, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 579 days.

(21) Appl. No.: 16/622,401

(22) PCT Filed: Oct. 9, 2019

(86) PCT No.: PCT/CN2019/110078
§ 371 (c)(1),
(2) Date: Dec. 13, 2019

(87) PCT Pub. No.: WO2021/031306
PCT Pub. Date: Feb. 25, 2021

(65) Prior Publication Data
US 2021/0371593 A1    Dec. 2, 2021

(30) Foreign Application Priority Data
Aug. 16, 2019    (CN) .......................... 201910757253.6

(51) Int. Cl.
| C08G 73/10 | (2006.01) |
| H01L 51/00 | (2006.01) |
| B82Y 20/00 | (2011.01) |
| B82Y 30/00 | (2011.01) |
| B82Y 40/00 | (2011.01) |

(52) U.S. Cl.
CPC ...... *C08G 73/1032* (2013.01); *H01L 51/0035* (2013.01); *H01L 51/0094* (2013.01); *B82Y 20/00* (2013.01); *B82Y 30/00* (2013.01); *B82Y 40/00* (2013.01)

(58) Field of Classification Search
CPC ............ C08G 73/1032; H01L 51/0035; H01L 51/0094; H01L 51/0097; B82Y 20/00; B82Y 30/00; B82Y 40/00; C08K 5/549; Y02E 10/549; C08J 5/18; C08J 2379/08; C08J 2483/04
USPC ...................................................... 257/40
See application file for complete search history.

(56) References Cited

U.S. PATENT DOCUMENTS

| 2011/0027598 | A1  |   | 2/2011 | Wu et al. |
| 2014/0166993 | A1* | 6/2014 | Leu ..................... H01L 51/5268 257/40 |
| 2015/0053611 | A1* | 2/2015 | Wang .................... B01D 71/64 427/419.5 |
| 2015/0148497 | A1* | 5/2015 | Haddad .................. C07F 7/087 548/406 |
| 2021/0189173 | A1* | 6/2021 | Zhu ...................... C09D 183/04 |

FOREIGN PATENT DOCUMENTS

| CN | 101372534 A | * | 2/2009 | ............... C08J 5/18 |
| CN | 101372534 A |   | 2/2009 | |
| CN | 109942848 A |   | 6/2019 | |
| CN | 110105759 A |   | 8/2019 | |
| EP | 1294561 B1 | * | 4/2005 | ............... B27N 1/00 |
| EP | 2280320 A2 |   | 2/2011 | |

OTHER PUBLICATIONS

Amy L. Brunsvold et al., "An Investigation of the Resistance of POSS Polyimide to Atomic Oxygen Attack", Proceedings of the 9th International Symposium on Materials in a Space Environment, Noordwijk, The Netherlands, Jun. 16-20, 2003 (ESA SP-540, Sep. 2003), 153-158. (Year: 2003).*
Ryo Tamaki et seq., "A Polyimide Nanocomposite from Octa(aminophenyl)silsesquioxane", Chem. Mater., 2003, 15, 793-797, published Jan. 17, 2003. (Year: 2003).*
C. Wang et al., "Fluorinated Polyimide/POSS Hybrid Polymers with High Solubility and Low Dielectric Constant", Chinese Journal of Polymer Science, 2016, 34(11): 1363-1372.
P. Yonghong et al., "Polyhedral octakis (trimenthylsiloxy) silsesquioxane /polyimide composite films: mechanical and hydrophobic properties", Chemical Research, May 2017, 378-385.
Study on Hydrophobic Modification and Performance of Polyimide Film.

* cited by examiner

*Primary Examiner* — Douglas J Mc Ginty
(74) *Attorney, Agent, or Firm* — Benesch, Friedlander, Coplan & Aronoff LLP

(57) ABSTRACT

A hydrophobic polyimide material and a preparation method thereof, and an organic electroluminescence light emitting diode are provided. The hydrophobic polyimide material includes organic/inorganic composite nanoparticles. The preparation method of the hydrophobic polyimide material includes steps: mixing polyamic acid solution and organic/inorganic composite nanoparticle solution evenly, and stirring to obtain solution of the hydrophobic polyimide material; coating the solution of the hydrophobic polyimide material on a surface of a substrate to obtain hydrophobic polyimide by baking and curing.

9 Claims, 2 Drawing Sheets

HYDROPHOBIC POLYIMIDE MATERIAL AND PREPARATION METHOD THEREOF, AND ORGANIC ELECTROLUMINESCENCE LIGHT EMITTING DIODE

FIELD OF INVENTION

The present disclosure relates to the field of polyimide film technology, and particularly relates to a hydrophobic polyimide material and a preparation method thereof, and an organic electroluminescence light emitting diode.

BACKGROUND OF INVENTION

With the use of polyimide in organic electroluminescence light emitting diodes (organic light emitting diodes, OLEDs), people further optimize their performance, such as making them increasingly thinner, increasingly transparent, and with an increasingly larger dielectric constant, etc. Presently, research and development about aspects of hydrophilicity and hydrophobicity is relatively rare. At present, polyimide films with excellent mechanical properties are usually used as an OLED sealing film material to achieve the purposes of flexibility and roll-to-roll (R2R), and as the outermost substrate, actually having self-cleaning effect is the sticking point.

Therefore, it is necessary to provide a hydrophobic polyimide material and a preparation method thereof, and an organic electroluminescence light emitting diode to overcome problems in the prior art.

SUMMARY OF INVENTION

The purpose of the present disclosure is to provide a hydrophobic polyimide material and a preparation method thereof, and an organic electroluminescence light emitting diode for solving problems of poor hydrophobicity of a polyimide film prepared by prior art.

In order to realize the purpose mentioned above, an embodiment of the present disclosure provides a hydrophobic polyimide material containing organic/inorganic composite nanoparticles.

Furthermore, in the hydrophobic polyimide material, a percentage by weight of the organic/inorganic composite nanoparticles ranges from 10 wt % to 30 wt %.

Furthermore, a chemical structure of the hydrophobic polyimide material is:

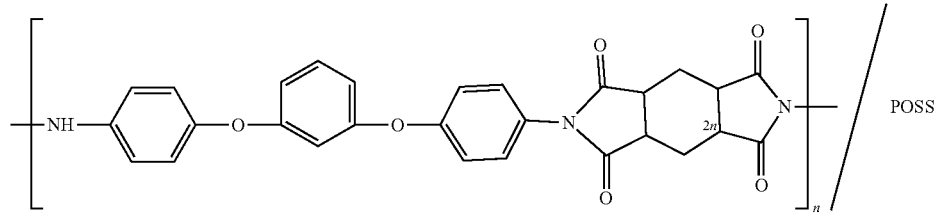

POSS indicates the organic/inorganic composite nanoparticles.

Furthermore, the organic/inorganic composite nanoparticles include polyhedral oligomeric silsesquioxane, a chemical structure of the polyhedral oligomeric silsesquioxane includes any one of chemical structures as follows:

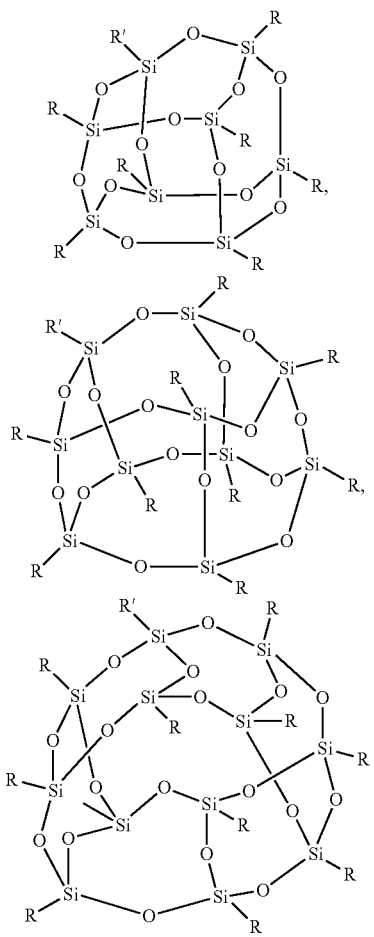

R and R' indicate symmetrical structures of alkyl group.

Another embodiment of the present disclosure provides a preparation method for preparing a thin film of hydrophobic polyimide, including steps as follow:

Dissolving dianhydride monomer into organic solvent, and stirring thoroughly to obtain dianhydride monomer solution.

Dissolving diamine monomer into organic solvent, and stirring thoroughly to obtain diamine monomer solution.

Adding the diamine monomer solution into the dianhydride monomer solution drop by drop, stirring at room temperature to make it be fully dissolved, and perform suction filtration to remove air bubbles in the solution in a vacuum environment, making the solution after the sucking to stand still at room temperature to make the air bubbles in the solution disappear to obtain polyamic acid solution.

Mixing the polyamic acid solution and organic/inorganic composite nanoparticle solution evenly, and stirring to obtain solution of the hydrophobic polyimide material.

Coating the solution of the hydrophobic polyimide material on a surface of a substrate to obtain hydrophobic polyimide by baking and curing.

Furthermore, the organic/inorganic composite nanoparticles are prepared by the method as follows:

Dissolving the organic/inorganic composite nanoparticles into organic solvent to obtain the organic/inorganic compounding nanoparticle solution with concentration in 1 mmol/L.

Furthermore, the organic solvent includes a mixture of N,N-dimethylacetamide and N-methyl pyrrolidone. A volume ratio of the N,N-dimethylacetamide and the N-methyl pyrrolidone ranges from 1:5 to 5:1.

Furthermore, the dianhydride monomer includes 1,2,4,5-cyclopentanetetracarboxylic dianhydride; the diamine monomer includes p-(diaminodiphenyl) diphenyl ether.

Furthermore, a molar ratio of the dianhydride monomer and the diamine monomer ranges from 1:90 to 6:1.

Another embodiment of the present disclosure provides an organic electroluminescence light emitting diode, including the hydrophobic polyimide material mentioned above.

Furthermore, the organic electroluminescence light emitting diode includes a flexible substrate layer, and a material using on the flexible substrate layer is the hydrophobic polyimide material.

The technical effect of the present disclosure is that the present disclosure provides a hydrophobic polyimide material and a manufacturing method thereof, and an organic electroluminescence light emitting diode, by introduced reactivity organic/inorganic composite nanoparticles, and a preferred structure of POSS unit has low surface tension, so that which changes an end capping of original polyamic acid and a microstructure of atomic blends, and finally realizes to increase hydrophobic performance of the film, which can be known as a hydrophobic compound by an water contact angle obviously, and greatly improving its service life and cleaning performance in a humid environment. The polyimide material that introducing organic/inorganic composite nanoparticles to modify polyimide to prepare a base material of an organic light emitting diode (OLED) to prepare the polyimide material with self-cleaning effect provides an idea to the field of OLED base materials.

DETAILED DESCRIPTION OF PREFERRED EMBODIMENTS

Figure 1:
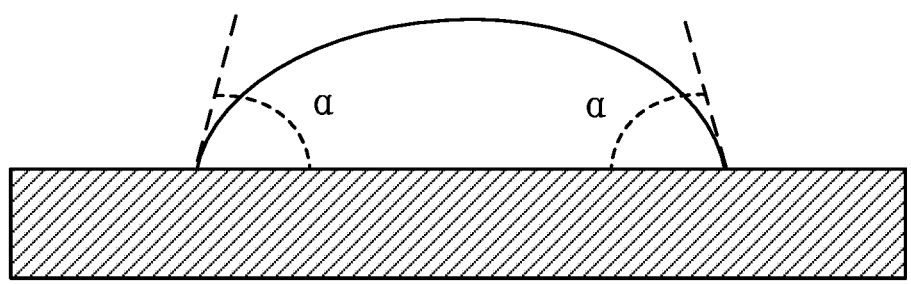
FIG. 1 is a schematic diagram of a water contact angle of polyimide (pure PI) in prior art.

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

"Prepared from . . . " and "comprise" are synonymy. The used terms "includes", "having", "has", "contains", or variants thereof used herein, are intended to be inclusive in a manner similar to the term "comprising." For example, a composition, a step, a method, a product or a device including the listed elements are not necessary to be limited to those elements, but it may comprise other elements unlisted or inherent elements of such a composition, step, method, product or device.

Also, it should also be noted that in some alternative embodiments, the steps of all methods described herein may occur out of the order. For example, two steps illustrated in succession may in fact be executed substantially concurrently or the two steps may sometimes be executed in the reverse order.

An embodiment of the present disclosure provides a hydrophobic polyimide material which contains organic/inorganic composite nanoparticles.

In this embodiment, in the hydrophobic polyimide material, a percentage by weight of the organic/inorganic composite nanoparticles ranges from 10 wt % to 30 wt %.

In this embodiment, a chemical structure of the hydrophobic polyimide material is:

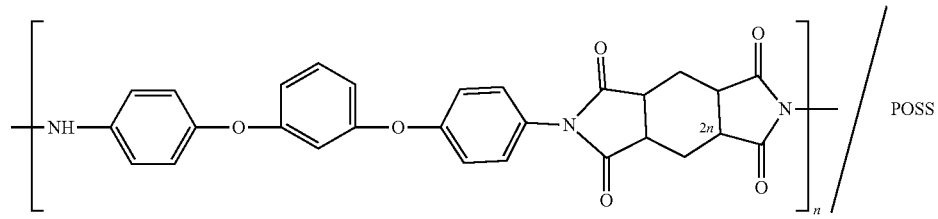

POSS indicates the organic/inorganic composite nanoparticles.

In this embodiment, the organic/inorganic composite nanoparticles include polyhedral oligomeric silsesquioxane, a chemical structure of the polyhedral oligomeric silsesquioxane includes any one of chemical structures as follows:

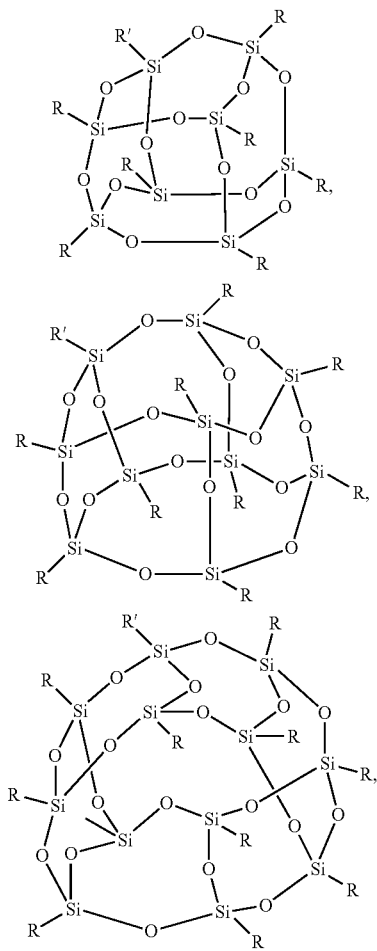

R and R' indicate symmetrical structures of alkyl group.

Another embodiment of the present disclosure provides a preparation method for preparing a thin film of hydrophobic polyimide, including steps as follow:

Step 1: dissolving dianhydride monomer into organic solvent, and stirring thoroughly to obtain dianhydride monomer solution. Specifically, adding a mixture of N,N-dimethylacetamide (DMAC) and N-methyl pyrrolidone (NMP) according to a volume ratio ranges from 1:5 to 5:1 into a double-necked flask to from organic solvent, and weighting dianhydride monomer ranging from 0.09 mmol to 0.99 mmol to dissolve in the organic solvent, and stirring thoroughly to obtain a dianhydride monomer solution.

Step 2: dissolving diamine monomer into organic solvent, and stirring thoroughly to obtain dianhydride monomer solution. Specifically, adding a mixture of N,N-dimethylacetamide (DMAC) and N-methyl pyrrolidone (NMP) according to a volume ratio ranges from 1:5 to 5:1 into a double-necked flask to from organic solvent, and weighting diamine monomer ranging from 0.2 mmol to 8 mmol, and stirring thoroughly to obtain a diamine monomer solution.

Step 3: adding the diamine monomer solution into the dianhydride monomer solution drop by drop, stirring at room temperature for 36 hours to 96 hours to make it be fully dissolved; removing the mechanical agitator and performing suction filtration, and then using a vacuum pump to suck air of the solution obtained from the suction filtration mentioned above to remove air bubbles in the solution; making the solution after the sucking to stand still at room temperature for 2 hours to 4 hours to make the air bubbles in the solution disappear to obtain a polyamic acid solution. A mechanical stirrer used to stir in the embodiment of the present disclosure is preferably to use a polytetrafluoroethylene (PTFE) rod to stir, and in another embodiment, it is also enable to use a magnetic stirrer having a stir bar.

Step 4: mixing the polyamic acid solution and organic/inorganic composite nanoparticle solution evenly, and stirring to obtain solution of the hydrophobic polyimide material. Furthermore, the organic/inorganic composite nanoparticles include polyhedral oligomeric silsesquioxane, carbon nano-tube, or silicon. The organic/inorganic composite nanoparticles are prepared by the method as follows: adding a mixture of N,N-dimethylacetamide (DMAC) and N-methyl pyrrolidone (NMP) according to a volume ratio ranges from 1:5 to 5:1 into a double-necked flask to from organic solvent, and weighting organic/inorganic composite nanoparticles with a corresponding mass to dissolve in the organic solvent to obtain an organic/inorganic compounding nanoparticle solution with a concentration in 1 mmol/L.

Step 5: coating the solution of the hydrophobic polyimide material on a surface of a substrate to obtain hydrophobic polyimide by baking and curing. Furthermore, a crosslinking curing process of the solution of the hydrophobic polyimide material continues 3 hours to 5 hours. A warming up temperature ranges from 4° C. to 10° C., and the baking stage is separated into two methods of a hard bake and a soft bake. The hard bake directly increases a temperature to be a maximum temperature, and keeps the maximum temperature about 1 hour, and then cooling. While the soft bake has twice or more than twice constant temperature processes, and finally cooling, thereby realizing the material to crosslink and remove a solvent in different constant temperature stages.

In summary, the organic solvent includes a mixture of N,N-dimethylacetamide and N-methyl pyrrolidone. A volume ratio of the N,N-dimethylacetamide and the N-methyl pyrrolidone ranges from 1:5 to 5:1.

In this embodiment, the polyamic acid solution is prepared by adopting a dianhydride monomer and a diamine monomer to act as reaction monomers, and a molar ratio of the dianhydride monomer and the diamine monomer ranges from 1:90 to 6:1.

Please refer to formula (1), the dianhydride monomer (compound B) includes 1,2,4,5-cyclopentanetetracarboxylic dianhydride, and the diamine monomer (compound A) includes p-(diaminodiphenyl) diphenyl ether. A preparation method of a main ingredient of the polyamic acid solution (compound C) is prepared by making 1,2,4,5-cyclopentanetetracarboxylic dianhydride and p-(diaminodiphenyl) diphenyl ether react, which reaction formula is generally demonstrated as the formula (1):

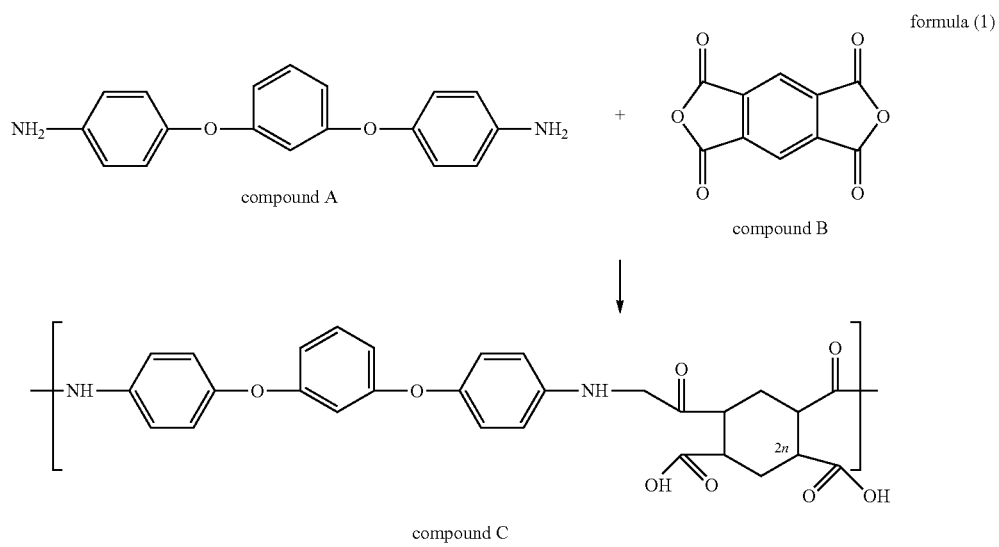

formula (1)

compound A compound B compound C

In the formula (1), the compound B is 1,2,4,5-cyclopentanetetracarboxylic dianhydride, which is the dianhydride monomer, and the compound A is p-(diaminodiphenyl) diphenyl ether, which is the diamine monomer. A molar ratio of the dianhydride monomer and the diamine monomer ranges from 1:90 to 6:1.

Mixing the polyamic acid solution and the organic/inorganic composite nanoparticle solution evenly, and stirring it for 3 hours to 10 hours to obtain a solution of the hydrophobic polyimide material. A percentage by weight of the organic/inorganic composite nanoparticles ranges from 10 wt % to 30 wt %, and the organic/inorganic composite nanoparticles include polyhedral oligomeric silsesquioxane (POSS).

In this embodiment, the organic/inorganic composite nanoparticles are preferred to be polyhedral oligomeric silsesquioxane (POSS). The polyhedral oligomeric silsesquioxane (POSS) particle is a material having excellent chemical stability, high electro-thermal power, a specific surface area, and low surface energy, which has an unique organic/inorganic composite structure and has important application on aspects such as enhancement and dielectric performance.

Introducing the POSS particles into a polymer system can improve film strength, rigidity, a modulus, impact resistance, thermal oxidation resistance, and retardant performance. Therefore, introducing POSS particles to form a polymer structure belongs to a graft chemical reaction, and in the prior art, it is normal chemical doping, which has great differences in principle. Presently, the field of application of polyimide is wide. When the polyimide is used in different fields, some properties of polyimide may constraint to each other. For example, strong heat resistance may cause a problem of difficulty on fabricating, and strong rigidity may also cause a problem that a color of a film is dark. In order to adapt requirements of development of technology and manufacturing application, exploration of polyimide materials is also in a direction of multi-functionality and high performance. While the polyhedral oligomeric silsesquioxane (POSS) particles have a material of excellent chemical stability, high electro-thermal power, a specific surface area, and low surface energy can meet requirements mentioned above.

In this embodiment, if the organic/inorganic composite nanoparticles are polyhedral oligomeric silsesquioxane (POSS), after the polyamic acid solution and the organic/inorganic compounding nanoparticle solution are mixed, a main ingredient of the polyamic acid solution is polyimide (compound C), and the compound C will react with polyhedral oligomeric silsesquioxane (POSS) to form a modified polyimide polymer (compound D), which is belong to a graft chemical reaction. A structure of the POSS unit has low surface tension, thereby changing an end capping of the original polyamic acid and a microstructure of atomic blends, and finally realizes to increase hydrophobic performance of the film, which can be known as a hydrophobic compound by an water contact angle obviously, and greatly improving its service life and cleaning performance in a humid environment. The reaction formula is generally demonstrated as the formula (2):

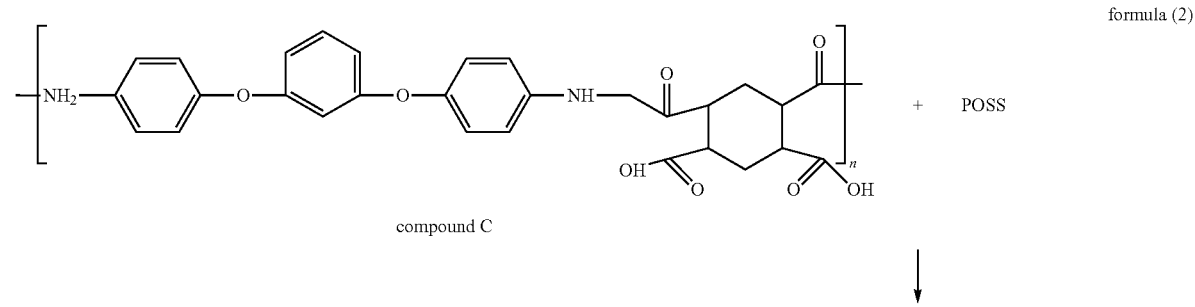

formula (2)

compound C

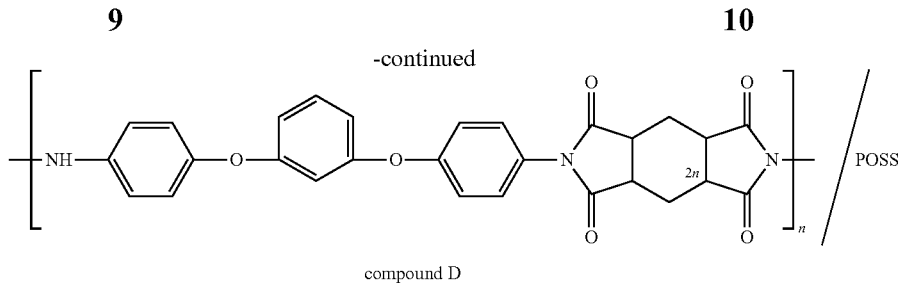

compound D

In the formula (2), POSS indicates organic/inorganic composite nanoparticles.

An embodiment of the present disclosure provides an organic electroluminescence light emitting diode, including the hydrophobic polyimide material mentioned above.

In this embodiment, the organic electroluminescence light emitting diode includes a flexible substrate layer, and a material using on the flexible substrate layer is the hydrophobic polyimide material.

A material used in the flexible substrate layer of prior art is polyimide, by testing, soaking polyimide (pure PI) in water for 3 days and directly taking it out can observe by eyes that a water halo which is wrinkle and absorbs water to be swelled. However, soaking the hydrophobic polyimide material (containing POSS) of the present disclosure in water for 3 days and directly taking it out can observe that its surface is still smooth, and meanwhile, there is no excessive water absorption, which can be fully described by a water contact angle test.

As illustrated in FIG. 1, a water contact angle α of polyimide (pure PI) of the prior art ranges from 50° to 70°.

Figure 2:
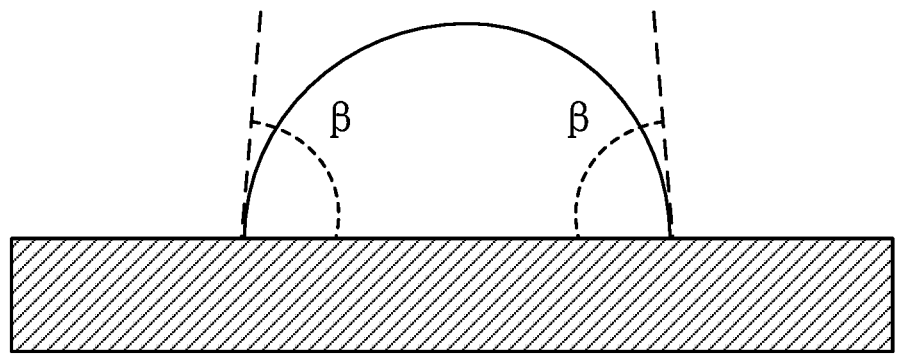
FIG. 2 is a schematic diagram of a water contact angle of hydrophobic polyimide material containing POSS of an embodiment of the present disclosure.

As illustrated in FIG. 2, a water contact angle β of the hydrophobic polyimide material (containing POSS) of this embodiment ranges from 75° to 87°, which greatly improve the hydrophobic property of the material.

Figure 3:
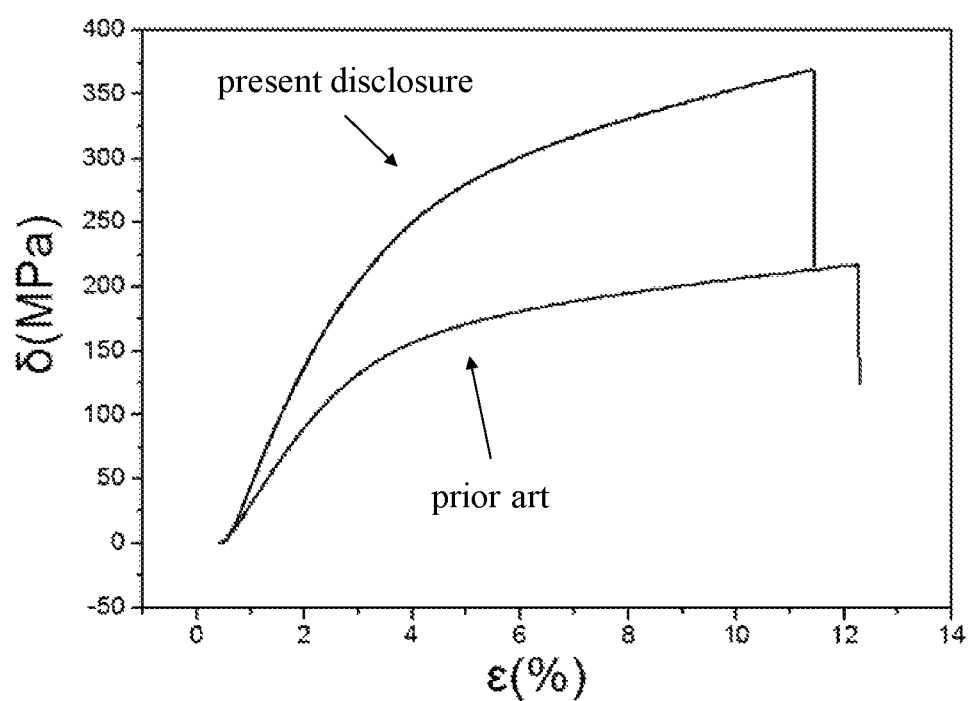
FIG. 3 is a diagram of stress to strain curves of a tensile property test of pure PI in prior art and the hydrophobic polyimide material containing polyhedral oligomeric silsesquioxane (POSS) of an embodiment of the present disclosure.

As illustrated in FIG. 3, which is a diagram of stress to strain curves of a tensile property test of polyimide (pure PI) in prior art and the hydrophobic polyimide material (containing POSS) of this embodiment. Performing the tensile property test on the hydrophobic polyimide material (containing POSS) of this embodiment can obtain the hydrophobic polyimide having a maximum elongation of 10% or more, meanwhile, a maximum tensile force of the hydrophobic polyimide doped with POSS particles can reach 375 MPa, which is about 85% higher than the 200 MPa of the maximum tensile stress of the polyimide (pure PI) of prior art. Therefore, using the hydrophobic polyimide material prepared by the manufacturing method of the present disclosure as a flexible base layer and applying it in manufacturing of the flexible base layer of the organic electroluminescence light emitting diode can satisfy actual requirements of fabricating processes of the organic electroluminescence light emitting diode.

The technical effect of the present disclosure is that the present disclosure provides a hydrophobic polyimide material and a manufacturing method thereof, and an application, by introducing reactivity organic/inorganic composite nanoparticles, wherein preferred a structure of the POSS unit has low surface tension, so that which changes an end capping of original polyamic acid and a microstructure of atomic blends, and finally realizes to increase hydrophobic performance of the film, which can be known as a hydrophobic compound by an water contact angle obviously, and greatly improving its service life and cleaning performance in a humid environment. The polyimide material that introducing organic/inorganic composite nanoparticles to modify polyimide to prepare a base material of an organic light emitting diode (OLED) to prepare the polyimide material with self-cleaning effect provides an idea to the field of OLED base materials.

The above-mentioned are preferred embodiments of the present disclosure. It should be noted that those skilled in the art, without departing from the technical theory of the present disclosure, can further make many changes and modifications, and the changes and the modifications should be considered as the scope of protection of the present disclosure.

What is claimed is:

1. A hydrophobic polyimide material, comprising organic/inorganic composite nanoparticles, wherein the organic/inorganic composite nanoparticles include polyhedral oligomeric silsesquioxane, a chemical structure of the polyhedral oligomeric silsesquioxane comprises any one of chemical structures as follows:

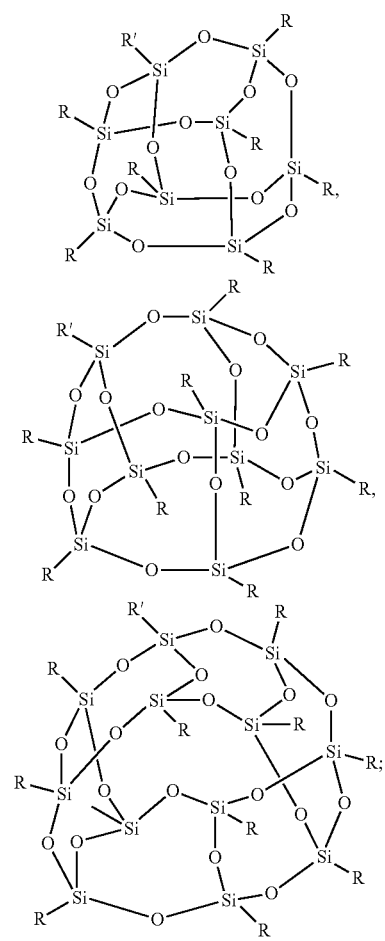

and
wherein R and R' indicate symmetrical structures of alkyl group.

2. The hydrophobic polyimide material as claimed in claim 1, wherein in the hydrophobic polyimide material, a percentage by weight of the organic/inorganic composite nanoparticles ranges from 10 wt % to 30 wt %.

3. The hydrophobic polyimide material as claimed in claim 1, wherein a chemical structure of the hydrophobic polyimide material is:

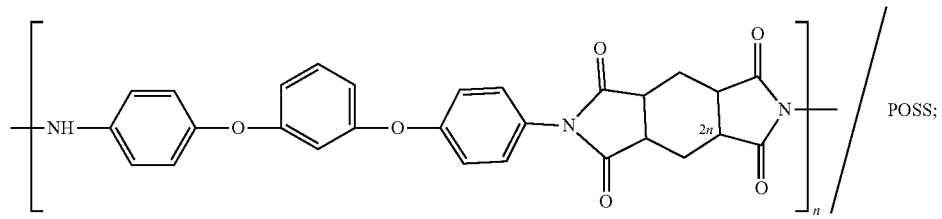

wherein POSS indicates the organic/inorganic composite nanoparticles.

4. A preparation method for preparing a thin film of hydrophobic polyimide, comprising:
dissolving dianhydride monomer into an organic solvent, and stirring thoroughly to obtain a dianhydride monomer solution;
dissolving diamine monomer into an organic solvent, and stirring thoroughly to obtain a diamine monomer solution;
adding the diamine monomer solution into the dianhydride monomer solution drop by drop, stirring it at room temperature to make it be fully dissolved, and performing suction filtration to remove air bubbles in the solution in a vacuum environment, making the solution after the sucking to stand still at room temperature to make the air bubbles in the solution disappear to obtain a polyamic acid solution;
mixing the polyamic acid solution and an organic/inorganic composite nanoparticle solution evenly, and stirring to obtain a solution of the hydrophobic polyimide material as claimed in claim 1; and
coating the solution of the hydrophobic polyimide material on a surface of a substrate to obtain hydrophobic polyimide by baking and curing.

5. The preparation method for the hydrophobic polyimide material as claimed in claim 4, wherein the organic solvent comprises a mixture of N,N-dimethylacetamide and N-methyl pyrrolidone; a volume ratio of the N,N-dimethylacetamide and the N-methyl pyrrolidone ranges from 1:5 to 5:1.

6. The preparation method for the hydrophobic polyimide material as claimed in claim 4, wherein the dianhydride monomer comprises 1,2,4,5-cyclopentanetetracarboxylic dianhydride; the diamine monomer comprises p-(diaminodiphenyl) diphenyl ether.

7. The preparation method for the hydrophobic polyimide material as claimed in claim 4, wherein a molar ratio of the dianhydride monomer and the diamine monomer ranges from 1:90 to 6:1.

8. An organic electroluminescence light emitting diode, comprising the hydrophobic polyimide material as claimed in claim 1.

9. The organic electroluminescence light emitting diode as claimed in claim 8, comprising a flexible substrate layer, and material using on the flexible substrate layer is the hydrophobic polyimide material.

* * * * *